United States Patent [19]

Sue et al.

[11] Patent Number: 5,071,693
[45] Date of Patent: Dec. 10, 1991

[54] MULTILAYER COATING OF A NITRIDE-CONTAINING COMPOUND AND METHOD FOR PRODUCING IT

[75] Inventors: Jiinjen A. Sue, Carmel; Harden H. Troue, Plainfield, both of Ind.

[73] Assignee: Union Carbide Coatings Service Technology Corporation, Danbury, Conn.

[21] Appl. No.: 687,084

[22] Filed: Apr. 18, 1991

Related U.S. Application Data

[63] Continuation of Ser. No. 405,131, Sep. 11, 1989, abandoned.

[51] Int. Cl.$^5$ .................. B32B 7/02; B32B 15/04
[52] U.S. Cl. ............................ 428/212; 427/248.1; 427/250; 427/405; 428/213; 428/215; 428/216; 428/220; 428/457; 428/698; 428/699; 428/938
[58] Field of Search ............. 428/212, 213, 551, 215, 428/698, 699, 220, 938, 457, 216; 427/248.1, 405, 250

[56] References Cited

U.S. PATENT DOCUMENTS

| | | | |
|---|---|---|---|
| 4,497,874 | 2/1985 | Hale | 428/551 |
| 4,554,201 | 11/1985 | Andreev et al. | 428/215 |

FOREIGN PATENT DOCUMENTS

| | | | |
|---|---|---|---|
| 2483848 | 12/1981 | France | 428/698 |
| 2135337A | 8/1984 | United Kingdom . | |

OTHER PUBLICATIONS

"Summary Abstract: Wear-Resistant Carbide-Boride Composite Coatings", H. Holleck, et al, 1985 American Vacuum Society, J. Vac. Sci. Technol. A 3 (6), Nov./Dec. 1985 pp. 2345-2347.

"Effect of Crystallographic Orientation on Erosion Characteristics of Arc Evaporation Titanium Nitride Coating" J. A. Sue et al, Surface and Coating Technology, 33(1987) pp. 169-181.

"Influence of Residual Compressive Stress on Erosion Behavior of Arc Evaporation Titanium Nitride Coating", J. A. Sue et al, Surface and Coatings Technology, 36(1988) pp. 695-705.

"Preparation and Behaviour of Wear-Resistant TiC/TiB$_2$, TiN/TiB$_2$ and TiC/TiN Coatings with High Amounts of Phase Boundaries", H. Holleck et al, Surface and Coatings Technology, 36(1988) pp. 707-714.

"New Results in d.c. Reactive Magnetron Deposition of TiN$_x$ Films", J. Musil et al, Thin Solid Films, 167(1988) pp. 107-119 Preparation and Characterization.

*Primary Examiner*—Thomas J. Herbert, Jr.
*Attorney, Agent, or Firm*—Cornelius F. O'Brien

[57] ABSTRACT

The invention relates to a multilayer coating of at least 2 layers of a nitride-containing compound, such as titanium nitride, in which at least one layer contains at least 2 atomic percent of nitrogen different than the nitrogen contained in an adjacent layer. The invention also relates to a method for producing the multilayer coating.

25 Claims, No Drawings

MULTILAYER COATING OF A NITRIDE-CONTAINING COMPOUND AND METHOD FOR PRODUCING IT

This application is a continuation of prior U.S. application Ser. No. 07/405,131, filing date Sept. 11, 1989, abandoned.

FIELD OF THE INVENTION

The invention relates to a wear and erosion resistant coating composed of alternate lamellar layers of a nitride-containing compound in which at least one layer contains at least 2 atomic percent of nitrogen different than the nitrogen contained in an adjacent layer. Preferably, the multilayer coating could comprise three or more layers in which one layer could be disposed between two adjacent layers and contain at least 2 atomic percent of nitrogen different than the nitrogen contained in each adjacent layer. The invention also relates to a method for producing the multilayer coating of a nitride containing compound.

BACKGROUND OF THE INVENTION

Resistance against erosion wear is normally related to the hardness of the wear part. Some articles are subject to solid particle erosion in which particles of various sizes and hardness are propelled at various angles against the surface of the articles. For example, a car traveling in the desert during a wind storm will encounter various size solid particles of sand traveling at various velocities hitting the car. If the size of the particles is large and the velocity of the particles is high, the coating on the car could be chipped or pitted. In turbomachines which operate in a dust environment, this solid particle erosion is a severe problem. Recently, physical and chemical vapor deposited coatings, such as titanium nitride coatings and zirconium nitride coatings, have been used to provide a protective layer having good hardness characteristics. These coatings have been found to have good erosion resistance to $Al_2O_3$ and $SiO_2$ particles at both high and low impact angles. Although these coatings have high hardness characteristics, they exhibit inherently brittle behavior and their erosion resistance at normal impact decreases markedly with increasing hardness and particle size of the erodent. It has been observed that dynamic impact of solid particle erodents onto a coated surface of an article can form lateral and/or median cracks around the impact site. Median cracks are responsible for the strength degradation of the material while lateral cracks, which grow from the center of impact parallel to the substrate surface and then propagate through the coating surface, account for most of the material loss during solid particle impact erosion. The solid particle impact erosion of these coatings at a 90° impact angle is due primarily to brittle fracture. Thin coatings are more suspectible to spalling and exposure of the substrate which may lead to premature failure of the article. When coatings applied by conventional techniques are exposed to particle impact, pinholes and/or lateral spalling pits generally result in the coating. Once the coating material is cracked, additional impact by even relatively small particles will cause furrowing or grooves in the coating material. In a turbomachine, this furrowing can greatly effect the overall performance of the turbomachine.

Based on the elastic-plastic theory, toughness and hardness are the dominant properties controlling the erosion behavior. Higher hardness is believed to increase erosion resistance at both low and high impingement angles while higher toughness reduces the vulnerability to brittle fracture and markedly increases 90° erosion resistance. An erosion resistant coating needs to be simultaneously hard and tough. However, hardness and toughness are generally in opposition in hard materials. Higher hardness is usually associated with greater brittleness. Multilayer hard compound materials have been found to have simultaneously high hardness and high toughness. The high hardness is an inherent property of hard compounds and the high toughness is attributed to the formation of a coherent or partly coherent interface boundary between two different hard compound layers. For example, it has been found that a $TiC/TiB_2$ multilayer coating has a better wear resistance than either the TiC or $TiB_2$ single layer. In cutting tool applications, the multilayer coated tool bits, having a $TiC/Al_2O_3/TiN$ three layer coating, or a two layer coating in which one layer is a nitride, carbide, boride, or silicide of a metal of Group VI and the other layer is a nitride or carbide of a metal of Group VI, have shown good performance in wear resistance.

An object of the present invention is to provide a multilayer coated substrate having good erosion and/or wear resistance characteristics to solid particle impact.

Another object of the present invention is to provide a multilayer coated substrate in which each of the layers comprises a nitride-containing compound and in which the nitrogen content of one layer is different than the nitrogen content of an adjacent layer.

Another object of the present invention is to provide a multilayer coated substrate in which each of the layers is a titanium nitride containing compound and in which the nitrogen content of one layer is less than or more than the nitrogen content in an adjacent layer.

Another object of the present invention is to provide a multilayer coated substrate comprising at least three layers in which each layer comprises a titanium nitride-containing compound having an atomic percent of nitrogen from 33% to 55% and wherein the nitrogen content of one layer has at least 2 atomic percent of nitrogen more than the nitrogen contained in an adjacent layer.

Another object of the present invention is to provide a multilayer coated substrate in which one layer is $Ti_2N$ mixed with titanium nitride having an atomic percent of nitrogen of about 40% and an adjacent layer is titanium nitride having an atomic percent of nitrogen of 40% to 55% and wherein the nitrogen content of one layer has at least 2 atomic percent of nitrogen more than the nitrogen contained in the adjacent layer.

The above and further objects and advantages of this invention will become apparent upon consideration of the following description.

SUMMARY OF THE INVENTION

The invention relates to a multilayer coated substrate comprising a substrate coated with at least two layers of a nitride-containing compound with each layer containing at least one additive from the group comprising titanium, zirconium, titanium alloys and zirconium alloys and wherein at least one layer contains at least 2 atomic percent of nitrogen different than the nitrogen contained in the adjacent layer. The layer could also contain at least one element from the group comprising aluminum, vanadium, molybdenum, niobium, iron, chromium and manganese. Preferably, the multilayer coated substrate would comprise three or more layers in which at least one layer would contain at least 2 atomic percent of nitrogen different than the nitrogen contained in each of the adjacent layers.

The invention also relates to a method for producing a multilayer nitride-containing coating on a substrate comprising the steps:

(a) placing a substrate to be coated in a chamber containing a titanium based target and a nitrogen-containing gas mixture;

(b) evaporating the titanium from the titanium based target to produce a titanium vapor to react with the nitrogen in the nitrogen-containing gas mixture to form a titanium nitride-containing layer of a desired nitrogen content on the substrate;

(c) changing the ratio of nitrogen to titanium in step (b) to form another titanium nitride-containing layer on the coated substrate that has a nitrogen content of at least 2 atomic percent of nitrogen different than the nitrogen contained in the previously deposited coating; and (d) repeating step (c) at least once to form a multilayer coating of at least two layers in which at least one layer contains at least 2 atomic percent of nitrogen different than the nitrogen contained in an adjacent layer. The ratio of nitrogen to titanium can be changed by altering the current, changing the flow of nitrogen or a combination of both.

One embodiment for producing a multilayer nitride containing coating on a substrate would comprise the steps:

(a) placing a substrate to be coated in a vapor deposition chamber having an anode and containing a titanium-based cathode along with a nitrogen-containing gas mixture;

(b) applying a voltage across the cathode and anode to establish a current to effect evaporation of the titanium from the titanium-based cathode to produce a titanium vapor to react with the nitrogen in the nitrogen-containing gas mixture to form a titanium nitride-containing layer of a desired nitrogen content on the substrate;

(c) changing the ratio of nitrogen to titanium in step (b) to form another titanium nitride containing layer on the coated substrate that has a nitrogen content of at least 2 atomic percent of nitrogen different than the nitrogen contained in the previously deposited coating; and (d) repeating step (c) at least once to form a multilayer coating of at least two layers.

Preferably, the nitrogen-containing gas mixture could be argon-nitrogen; krypton nitrogen; helium-nitrogen; xenon-nitrogen; neon-nitrogen or the like.

The nitride-containing compound of each layer should have an atomic percent of nitrogen from 33% to 55%, and preferably the nitride-containing compound of one layer can have an atomic percent of nitrogen from 40% to 55%, preferably 42% to 50%, and the nitride containing compound of an adjacent layer can have an atomic percent of nitrogen from 33% to 45%, preferably 39% to 42%, provided that the nitrogen content in one layer is at least 2 atomic percent of nitrogen different than the nitrogen content in an adjacent layer. The multilayer coating can be deposited by using conventional process techniques such as chemical vapor deposition and physical vapor deposition such as arc processes, dc and rf magnetron sputtering, reactive ion plating and the like. The changing of the ratio of nitrogen to titanium for the alternate lamellar layers will interrupt the grain growth process of the coating compound so that the grain size of the compound is no larger than the thickness of the individual layers.

A layer containing less than 33 atomic percent of nitrogen will be relatively reactive and susceptible to burning during solid particle impact. A layer containing more than 55 atomic percent of nitrogen will generally have a relatively high compressive stress and be prone to lateral spalling.

The preferred coating would comprise a layer of titanium nitride having an atomic percent of nitrogen from 40% to 55% alternating with a layer of titanium nitride having an atomic percent of nitrogen from 33% to 45% and wherein at least one layer has at least 2 atomic percent of nitrogen different than the nitrogen content in each adjacent layer on opposite sides of such layer. Titanium nitride with the above ranges of nitrogen can have the same orientation and crystallographic structure with a small difference in lattice spacings so that coherent interfaces between the layers can be expected to produce a high toughness characteristic.

Although not wanting to be bound by theory, it is believed that the toughness enhancement in titanium nitride multilayer coatings of this invention can be explained by two different mechanisms. Firstly, at least after every 5 microns thick coated layer, preferably after every 1 micron or less thick coated layer, the nitrogen in the coating composition should be changed to provide for small size crystallites and small columnar grains in each layer. For example, interruption of the crystal growth by varying the nitrogen content of the coating composition after depositing a 1 micron thick layer of the coating can generally produce crystal size about 0.02 micron or less while a 20 micron thick single coating will generally produce crystals up to 0.07 micron in size. Using fixed deposition conditions, titanium nitride coatings of various thickness were deposited on a substrate and the average grain size of the crystals produced in each coated layer was determined. The data obtained are shown in Table 1.

TABLE 1

| Thickness of Coating (microns) | Average Grain Size of Crystal (microns) |
|---|---|
| 20 | 0.074 |
| 16 | 0.059 |
| 7 | 0.045 |
| 4 | 0.032 |

This data clearly demonstrates that the average crystal size in a 20 micron thick single layer coating of TiN will be more than two times larger than the size of the crystals in a 20 micron thick 5-layer coating with each layer being 4 microns thick. The advantages of smaller crystallite sizes in the multilayer coating is that they provide greater toughness as well as hardness to the overall coating.

Secondly, layered structure coatings are toughened due to the interference of layer interfaces with crack propagation. In other words, the coherent and partly coherent interface between layers can absorb the impact energy by deflecting the cracks and/or making the propagation path of cracks more tortuous.

Hardness and toughness of a multilayer coating are closely related to compositions and spacings of layers. The individual layer thickness and overall thickness of the multilayer coating depends on specific applications. For systems applications requiring high toughness, the layer with the smaller content of nitrogen should be from 1 to 20 times thicker than the layer containing the higher content of nitrogen. An overall coating thickness of from 5 microns up to 30 microns thick is generally adequate for most erosion applications.

The thickness of the individual layers can vary greatly as for example between 0.1 to 5 microns thick, preferably about 1 micron thick. The number of layers should be at least two so that at least one layer will have an atomic percent of nitrogen of 2% more or 2% less than the nitrogen content in the adjacent layer.

In accordance with this invention, the number of layers of a nitride-containing compound forming the coating of this invention can vary from two up to any number desired for a particular application. Generally, 5 to 50 layers of the coating would be suitable for most applications employing turbomachines that operate in a dust environment. For most applications, 15 to 40 layers would be preferable.

A preferable multilayer coating would be a layer of $Ti_2N$ mixed with titanium nitride having an atomic percent of nitrogen of about 40% alternating with a layer of a titanium-nitride compound having an atomic percent of nitrogen from 40% to 55%. Another preferred coating would be a multilayer consisting of layers of titanium-aluminum nitride compound (e.q. $TiAlN_x$) having an atomic percent of nitrogen from 33% to 55%, provided that each layer contain at least 2 atomic percent of nitrogen different than the nitrogen contained in an adjacent layer. The aluminum in the titanium aluminum alloy could range from 10 to 60 atomic percent.

In some applications, it may be advisable to have a relatively thick first layer of the nitride containing compound to support subsequent multilayers of the coating and/or a thick top layer to provide a harder top surface.

The multilayer coating of this invention is ideally suited for coating substrates made of materials such as titanium, steel, aluminum, nickel, cobalt, alloys thereof and the like.

EXAMPLE 1

Multilayer titanium nitride coatings were deposited on Ti 6Al-4V substrates using a physical vapor deposition arc evaporation process. Before deposition, the vapor deposition chamber was evacuated to a pressure below $7 \times 10^{-4}$ Pa and then backfilled with argon to 0.7 Pa. The substrate to be coated was sputtered to remove surface contaminants. Subsequently, a d.c. arc was activated across a titanium cathode and a chamber which acts as an anode to evaporate Ti from the Ti cathode in an $Ar-N_2$ gas mixture at an overall pressure between 1.3 to 4.8 Pa. The ionized Ti vapor reacted with $N_2$ ions and then formed titanium nitride coatings on the substrates. The layered structure of the coating was formed by altering the nitrogen $N_2$ gas flow rates during the deposition. Typically, the coating consisted of a lamellar structure of A and B nitride layers in which the thickness of the B layer was greater than that of the A layer. The nitrogen concentration in the A layer was generally greater than the nitrogen content in the B layer.

A number of multilayer coatings with various layer thicknesses of A and B were produced. The nitrogen concentrations in the layers of the coatings were determined by sputtered neutral mass spectrometry. A coating with a known composition was used as a chemistry standard in the analysis. The layer thicknesses of A and B, the $N_2$ concentration in the layers, and the difference in $N_2$ concentration between the A and B layers are given in Table 2.

The crystallographic orientation, interplanar spacing in (111) and crystallite size of these coatings, given in Table 2, were determined by X-ray diffractometry. The preferred orientation was determined from the texture coefficient of reflections (hkl). Interplanar spacings were calculated according to the Bragg equation, $\lambda = 2d \sin \theta$; where $\lambda$ is the wavelength of the X-rays, d the interplanar spacing between atomic planes in the crystal, and $\theta$ the angle between the atomic plane and both the incident and reflected beams. The crystallite size was determined based on the (111), (200) and (220) lines broadening excluding the instrumental broadening which was determined from an annealed stoichiometric TiN powder.

Erosion properties of the multilayer coatings and the single layer $TiN_x$ coatings on $1.5 \times 25 \times 50$ mm Ti-6Al-4V samples were determined by impacting with angular alumina particles at 20° and 90° impingement angles. The test apparatus was set up according to the recommended guidelines of the American Society of Testing Materials, ASTM G 76-83. Compressed air with a pressure of 276 kPa was used to carry alumina particles with a nominal particle size of 50 microns through a 5 mm diameter alumina nozzle. The nominal particle velocity was 60 meters per second ($ms^{-1}$) and the nozzle-to-specimen distance was maintained at 100 mm. In each test, at least 0.6 and 0.2 Kg of alumina particles was used for 20° and 90° erosion, respectively. Generally, the erosion rate was measured in terms of the weight loss of the coating per unit gram of the erodent used in the test. The erosion resistance of the coatings is defined as the reciprocal of the ratio of the erosion rate of the measured coatings to the typical single layer stoichiometric TiN coating, (Sample 6). The test results of these coatings are given in Table 3.

The preferred orientation of a typical A layer is in <111> and the B layer either in <111> <200> or <220>. The A layer is defined as having relatively higher $N_2$ concentration than the B layer. Apparently, the preferred orientation of the coating depends strongly on the chemical composition of the coating. Therefore, various preferred orientations in <111>, or a combination of <111> and <200> have a relatively higher overall $N_2$ concentration than that with a <200> or <220> preferred orientation.

During deposition, interdiffusion occurred between the A and B layers due to thermal heating, resulting in a small difference in nitrogen concentration from 2.6 to 5.4 atomic percent which depends primarily on the thickness of the layers. As a result of the formation of a layered structure, the values of interplanar spacing $d_{111}$ of the multilayer coatings, Samples 1 to 5 are between that of the single A layer coating (Sample 6) and the single B layer coating (Sample 7). Considering an anisotropic growth of crystallites, the crystallite size of the multilayer coating is significantly smaller than that of the single layer coating. The multilayer coatings with a preferred orientation in <111> and in combination of <111> and <200> have substantially smaller crystallites compared with the single layer coating. In the coatings with a preferred orientation in <200> and <220>, the multilayer coating exhibited finer crystallite size than the crystallite size in the single layer coating, e.q. compare Samples 3, 4 and 5 with Sample 7.

Both Samples 2 and 3 had <111> and <200> preferred orientation, a 2.8 and 2.6 atomic percent of nitrogen concentration difference between adjacent layers, respectively. Both coatings showed substantial erosion performance improvement over the single layer titanium nitride coatings Samples 6 and 7 at both 20° and 90° impingement angles.

Sample 1 coating had a B/A layer thickness ratio of 3.9 and preferred orientation in both <111> and <200>. The nitrogen concentration difference between adjacent layers in the coating was 5.4 atomic percent. The erosion resistances of the Sample 1 coating were 1.1 and 8 times that of a single layer TiN coating (Sample 6) at 20° and 90° impingement angles, respectively. Compared with a single layer substoichiometric $TiN_x$ coating (Sample 7), the Sample 1 coating showed little or no improvement at 90° and 20° impingement angles, respectively. However, the Sample 1 coating showed at least 3 times improvement in furrowing resistance over the Sample 6 and 7 coatings as observed by the dimensions of furrows formed from the 50 micron erosion at 10° impingement angles. The dimensions of the furrows were measured in a longitudinal direction (parallel to the particle flow direction) and in the transverse direction. The furrow dimensions observed for Samples 1, 6 and 7 are shown in Table 4.

The Sample 5 coating had a B/A layer thickness ratio of 9.1 and a <200> preferred orientation. The nitrogen concentration difference between adjacent layers in this coating was 2.8 atomic percent. The erosion performance of this coating was substantially better than that of the Sample 6 TiN coating at both 20° and 90° impingement angles. However, compared with the substoichiometric $TiN_x$ coating, (Sample 7), the improvement in erosion resistance of the Sample 5 coating was only found at 20° impingement angle.

EXAMPLE 2

An eight layer coating (Sample Coating 8) was deposited on an Inconel (trademark for alloy containing 76Ni; 15Cr and 9% Fe) strip in which a 0.4 micron layer of titanium nitride having an atomic percent of nitrogen of about 50% was alternated with a 2.2 micron layer of titanium nitride having an atomic percent of nitrogen of about 41%. Single layered coating, identical to Sample Coating 6 and 7 of Example 1, were also produced. The three samples were tested for low-stress abrasion resistance using a dry sand/rubber wheel abrasion tester which is described in ASTM G65-80. The test consisted of contacting each coated sample with the wheel and then continuously rotating the wheel for 3000 revolutions. The weight loss of the coating for each sample was measured by weighing each sample before and after the test to an accuracy of 0.001 milligrams. The weight loss of each sample was converted to volume loss in cubic millimeters per 1000 revolutions ($mm^3$/1000 rev.). The data obtained are shown in Table 5.

The data in Table 5 clearly show that the multilayer coating (Sample Coating 8) exhibited better abrasion resistance than either of the single layer coatings (Sample Coatings 6 and 7).

TABLE 5

| Sample Coating | Volume Loss - $mm^3$/1000 rev. |
| --- | --- |
| 6 | 1.0 |
| 7 | 0.93 |
| 8 | 0.89 |

Although specific embodiments of this invention have been described, it should be understood that various modifications may be made without departing from the spirit of this invention.

What is claimed:

1. A multilayer coated substrate comprising a substrate coated with at least three layers of a nitride-containing compound wherein the composition of each layer is a nonstoichiometric composition which contains at least 2 atomic percent of nitrogen different than the nitrogen contained in an adjacent layer.

TABLE 2

| Sample Coating | Layer Thickness (microns) | | Total Number of Layers | $N_2$ Concentration Atomic Percent | | $N_2$ Concentration Difference between A and B layers Atomic Percent |
| --- | --- | --- | --- | --- | --- | --- |
| | A | B | | A | B | |
| 1 | 0.33 | 1.3 | 20 | 46.2 | 40.8 | 5.4 |
| 2 | 0.13 | 1.3 | 18 | 44.0 | 41.2 | 2.8 |
| 3 | 0.13 | 1.0 | 38 | 41.5 | 38.9 | 2.6 |
| 4 | 0.12 | 1.0 | 22 | 39.2 | 35.0 | 4.2 |
| 5 | 0.11 | 1.0 | 22 | 40.8 | 38.0 | 2.8 |
| 6 | 20 | — | 1 | ~50 | — | — |
| 7 | — | 19 | 1 | — | ~41 | — |

TABLE 3

| Sample Coating | Interplanar Spacing $d_{111}$ (nm) | Preferred Orientation | Texture Coefficient | | | Crystallite Size, $D_{hkl}$ (nm) | | | Erosion Resistance | |
| --- | --- | --- | --- | --- | --- | --- | --- | --- | --- | --- |
| | | | (111) | (200) | (220) | (111) | (200) | (220) | 20° | 90° |
| 1 | 0.2459 | (111), (200) | 1.61 | 1.10 | 0.29 | 20.5 | 12.2 | 10.3 | 1.1 | 8 |
| 2 | 0.2452 | (111) | 2.64 | 0.24 | 0.12 | 31.5 | 19.6 | 13.2 | 2 | 14 |
| 3 | 0.2452 | (200) | 0.56 | 1.90 | 0.54 | 17.5 | 16.3 | 15.1 | 1.7 | 9.2 |
| 4 | 0.2452 | (220) | 0.36 | 0.32 | 2.32 | 18.2 | 6.9 | 12.5 | 0.74 | 1.6 |
| 5 | 0.2455 | (200) | 0.66 | 1.59 | 0.75 | 18.9 | 12.2 | 12.6 | 1.7 | 3.3 |
| 6 | 0.2459 | (111) | 2.99 | 0.01 | 0 | 73.8 | 41.5 | — | 1 | 1 |
| 7 | 0.2450 | (220) | 0.10 | 0.44 | 2.46 | 20.6 | 13.5 | 20.4 | 1.4 | 7.9 |

TABLE 4

| Sample Coating | Furrow Dimension Longitudinal × Transversal direction (nm) |
| --- | --- |
| 1 | 0.17 × 0.02 |
| 6 | 0.37 × 0.06 |
| 7 | 0.31 × 0.04 |

2. The multilayer coated substrate of claim 1 wherein the nitride-containing compound is titanium nitride.

3. The multilayer coated substrate of claim 1 wherein the nitride-containing compound of one layer is Ti$_2$N mixed with titanium nitride having an atomic percent of nitrogen of about 40%; the nitride-containing compound of an adjacent layer is nonstoichiometric titanium nitride having an atomic percent of nitrogen of 40% to 55%; and the nitrogen content in one layer has at least 2 atomic percent of nitrogen different than the nitrogen content in an adjacent layer.

4. The multilayer coated substrate of claim 1 wherein the overall thickness of the coating is from 5 to 30 microns.

5. The multilayer coated substrate of claim 1 wherein the thickness of each layer is from 0.1 to 5 microns thick.

6. The multilayer coated substrate of claim 1 wherein the ratio of the thickness of the layer containing the least amount of nitrogen to the thickness of an adjacent layer containing the higher amount of nitrogen is from 1 to 20.

7. The multilayer coated substrate of claim 1 wherein at least one layer contains at least one additive from the group comprising titanium, titanium alloys, zirconium and zirconium alloys.

8. The multilayer coated substrate of claim 7 wherein at least one layer contains at least one element from the group comprising aluminum, vanadium, molybdenum, niobium, iron, chromium and manganese.

9. The multilayer coated substrate of claim 1 wherein the nonstoichiometric composition of the nitride-containing compound of each layer has an atomic percent of nitrogen from 33% 55% and the nitrogen content in one layer has at least 2 atomic percent of nitrogen different than the nitrogen content in an adjacent layer.

10. The multilayer coated substrate of claim 9 wherein the nitride-containing compound of one layer has an atomic percent of nitrogen from 33% to 45% and the nitride-containing compound of an adjacent layer has an atomic percent of nitrogen from 40% to 55%.

11. The multilayer coated substrate of claim 9 wherein said nitride-containing compound is titanium nitride.

12. The multilayer coated substrate of claim 9 wherein said nitride-containing compound is titanium aluminum nitride.

13. The multilayer coated substrate of claim 1 wherein the multilayer coating comprises up to 50 layers.

14. The multilayer coated substrate of claim 13 wherein the multilayer coating comprises from 15 to 40 layers.

15. The multilayer coated substrate of claim 1 wherein the substrate is selected from the group consisting of titanium, steel, aluminum, nickel, cobalt and alloys thereof.

16. The multilayer coated substrate of claim 15 wherein said nitride-containing compound is titanium nitride.

17. The multilayer coated substrate of claim 15 wherein said nitride-containing compound is titanium aluminum nitride.

18. The multilayer coated substrate of claim 15 wherein said nitride-containing compound is a nonstoichiometric composition of titanium nitride and said substrate is titanium.

19. A method for producing a multilayer nitride-containing coating on a substrate comprising the steps:
  (a) placing a substrate to be coated in a chamber containing a titanium-target and a nitrogen-containing gas mixture;
  (b) evaporating the titanium from the titanium target to produce a titanium vapor to react with the nitrogen in the nitrogen-containing gas mixture to form a nonstoichiometric titanium nitride-containing layer of a desired nitrogen content on the substrate;
  (c) changing the nitrogen content of the nitrogen-containing gas mixture and repeating step (b) to form another nonstoichiometric titanium nitride-containing layer on the coated substrate that has a nitrogen content of at least 2 atomic percent of nitrogen different than the nitrogen contained in the previously deposited layer; and
  (d) repeating step (c) at least twice to form a multilayer coating of at least three nonstoichiometric titanium nitride-containing layers in which at least one layer contains at least 2 atomic percent of nitrogen different than the nitrogen contained in an adjacent nonstoichiometric titanium nitride-containing layer.

20. The method of claim 19 wherein said nitrogen-containing gas mixture is selected from the group consisting of argon-nitrogen; krypton-nitrogen; helium-nitrogen; xenon-nitrogen; and neon-nitrogen.

21. The method of claim 17 wherein said nitrogen-containing gas mixture is argon-nitrogen.

22. The method of claim 19 wherein said substrate is selected from the group comprising titanium, steel, aluminum, nickel, cobalt and alloys thereof.

23. The method of claim 17 wherein step (d) is repeated until a multilayer coating is produced having from up to 50 layers.

24. The method of claim 19 wherein the thickness of the multilayer coating is from 5 to 30 microns thick.

25. The method of claim 19 wherein the first deposited layer in step (b) has a greater nitrogen content than the second deposited layer in step (c).

* * * * *